United States Patent [19]

Meretsky et al.

[11] 4,210,859
[45] Jul. 1, 1980

[54] INDUCTIVE DEVICE HAVING ORTHOGONAL WINDINGS

[75] Inventors: Paul L. Meretsky, 46/11 Keren Hyesod; Amiram Carmon, 35 Ruth St., both of Haifa, Israel, 32000

[73] Assignees: Technion Research & Development Foundation Ltd.; Paul L. Meretsky; Amiram Carmon, all of Haifa, Israel

[21] Appl. No.: 897,395

[22] Filed: Apr. 18, 1978

[51] Int. Cl.² .............................................. G05F 7/00
[52] U.S. Cl. .................................. 323/44 R; 323/56; 336/188; 336/214
[58] Field of Search .................. 323/44 R, 48, 49, 50, 323/56, 60, 61; 336/83, 188, 214, 215, 221, 223, 234, 170, 173; 365/140, 143, 144, 145; 307/88

[56] References Cited

U.S. PATENT DOCUMENTS

| 743,444 | 11/1903 | Burgess | 336/83 |
|---|---|---|---|
| 1,287,982 | 12/1918 | Hartley | 336/83 |
| 1,473,862 | 11/1923 | Nyman | 307/13 |
| 1,504,882 | 8/1924 | Elmen | 336/170 |
| 2,399,382 | 4/1946 | Polydoroff | 343/788 |
| 2,623,205 | 12/1952 | McCreary | 323/45 |
| 2,910,654 | 10/1959 | Wiegand | 331/165 |
| 2,966,704 | 1/1961 | O'Brian et al. | 336/83 |
| 2,983,829 | 5/1961 | Wanlass | 307/406 |
| 3,060,410 | 10/1962 | Wanlass | 365/142 |
| 3,061,820 | 10/1962 | Wanlass | 365/143 |
| 3,088,039 | 4/1963 | Wanlass | 307/422 |
| 3,097,305 | 7/1963 | Wanlass | 307/422 |
| 3,124,785 | 3/1964 | Wanlass | 365/142 |
| 3,134,964 | 5/1964 | Wanlass | 365/142 |
| 3,189,879 | 6/1965 | MacIntyre et al. | 365/143 |
| 3,222,656 | 12/1965 | Olsson | 365/142 |
| 3,360,662 | 12/1967 | Smith | 307/408 |
| 3,371,217 | 2/1968 | Flannery et al. | 307/403 |
| 4,004,251 | 1/1977 | Hesler et al. | 336/83 |

FOREIGN PATENT DOCUMENTS

543664 12/1955 Belgium ..................................... 336/83

OTHER PUBLICATIONS

*IEEE Trans. on Power Apparatus & Systems* Nov./Dec. 1972 vol. Pas-91, No. 6, pp. 2494-2504.
The Paraformer—A New Passive Power Conversion Device by Dr. S. D. Wanlass et al.
*Journal of Applied Physics* vol. 48, No. 4, Apr. 1977 pp. 1697-1699.

*Primary Examiner*—William M. Shoop
*Attorney, Agent, or Firm*—Brumbaugh, Graves, Donohue & Raymond

[57] ABSTRACT

An inductive device comprising a magnetic core and windings for producing two or three substantially orthogonal magnetic fields at all points within the core. The device may be utilized as an inductor or transformer in a variety of applications.

51 Claims, 23 Drawing Figures

INDUCTIVE DEVICE HAVING ORTHOGONAL WINDINGS

BACKGROUND OF THE INVENTION

The present invention relates to structures for creating a two or three-dimensional magnetic field within a magnetic core.

It is a fact, easily proven experimentally, that a material totally magnetically saturated in one direction is still magnetically active in directions perpendicular to the existing field. For example, a piece of iron in unidirectional magnetic saturation is still attracted to a permanent magnet. Alternatively, the force required to separate two identical horseshoe magnets, one of which is attached to the side of the other, does not change appreciably if the keeper of the magnet with the free poles is in or out of place. Actually, such magnets are in the remanance, rather than the saturated state; however, contemporary permanent magnets are within 20% of saturation at remanance.

It is also a fact that magnetic saturation is a vector and, as such, has three orthogonal components. There is therefore an X, Y and Z saturation which is fully consistent with the spin theory of magnetism, since spin itself is a vector. Saturation is defined as total spin alignment in one axis, which does not imply that alignment has occurred in the other two axes if the saturation is in the direction of one axis only.

It is an object of the present invention to provide an improved inductive device having a two or three-dimensional magnetic field; that is, a magnetic field comprised of two or three orthogonal components.

It is a further object of the present invention to provide applications for an inductive device having a two or three-dimensional magnetic field.

SUMMARY OF THE INVENTION

These objects, as well as other objects which will become apparent in the discussion that follows, are achieved, according to the present invention, by providing a magnetic core formed of ferromagnetic material and means for producing two or three substantially orthogonal magnetic fields at all points within the core.

As will be pointed out hereinbelow, an inductive device of this type has unique properties which are not found in conventional devices having only a single, uni-axial magnetic field. Also, this structure is useful in an endless variety of applications above and beyond the application of providing several independent inductors or transformers on the same magnetic core.

Specific examples of, and results of experiments with inductive devices having two and three orthogonal magnetic fields are set forth in the following Description of the Preferred Embodiments. The experimental results are truly astonishing and were not predicted with the known spin theory of magnetism. From this theory one would assume that saturation of ferromagnetic material in one direction would have little effect, or possibly would increase the rate of fall-off of inductance due to saturation in another, orthogonal direction. To the contrary, the experimental results demonstrate that the maintenance of a magnetic field in one direction reduces the rate of fall-off of inductance in a winding producing a field in an orthogonal direction. In fact, if two orthogonal fields are maintained in the material, the inductance of a winding producing a field in a third orthogonal direction is increased substantially.

DESCRIPTION OF THE PREFERRED EMBODIMENTS

The preferred embodiments of the inductive device according to the present invention will now be described with reference to FIGS. 1-23 of the drawings. In each of the device geometries, substantially all of the core material is subject to either two or three orthogonal magnetic fields. Some basic principles concerning these devices will be described and a number of useful applications suggested. However, it is not intended that the present invention be limited to the specific applications disclosed. The present invention, which relates to structures for creating two and three-dimensional magnetic fields, is susceptible to a virtually limitless number of practical applications, and it is intended to include all such applications within its scope.

For the purposes of subsequent discussion, it is useful to define two types of electrical windings: a "type A" winding and a "type B" winding. A winding consists of as many turns of insulated wire as are necessary or desirable in the particular application involved.

A type A winding is defined as a winding which encloses ferromagnetic material while it, itself, is only partially enclosed by the material. Examples of type A windings are the windings of a solenoid (bar magnet) and windings placed on a toroid, or on a "C-core". A C-core may be viewed as a flattened toroid which is cut so as to permit one-half of the steel cross section to be surrounded by a bobbin wound coil.

A type B winding is defined as a winding which both encloses magnetic material and is itself enclosed by the material. As an example, a type B winding is found in a pot core. Such a core contains a wound bobbin used to excite the core material. A pot core may be viewed as a cut toroid—i.e., an "O-shaped cross section"—rotated through 360° about a line which is tangent to one edge. This line forms the central axis of the pot core and, thus, the bobbin within it. If the inner diameter of the bobbin is to be increased, the rotation may be carried out away from the axis of the bobbin so as to generate a void parallel to the axis of rotation. The result is a pot core with a central hole, which may be used to mount the core or adjust its inductance.

Figure 1:
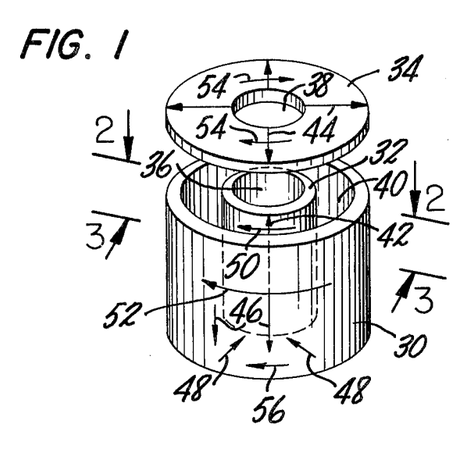
FIG. 1 is a perspective view of the pot core of an inductive device in accordance with the present invention, showing the directions of two orthogonal magnetic fields.

A typical pot core is illustrated in FIG. 1. The core, which may be made of ferrite, steel or some other ferromagnetic material, comprises an outer cylindrical pot wall 30, a center post 32 and a pot cover 34. The center post 32 may be provided at its center with a post hole 36 and the cover 34 with a cover hole 38. An annular space 40 is formed between the pot wall 30 and the center post 32. In this space is arranged a bobbin (not shown) which supports one or more coils of suitably dimensioned electrical wire. It may be seen that, when the pot core cover 34 is in place, the bobbon coil or coils form a type B winding, because they are completely enclosed by the core material. The magnetic field generated by this type B winding passes upwardly through the center post as indicated by the arrow 42, outwardly across the cover as indicated by the arrows 44, downwardly in the pot wall as indicated by the arrows 46, and inwardly on the bottom as indicated by the arrows 48. The field may, of course, pass in the opposite direction depending upon the direction of flow of the current through the winding.

Now, since the post hole 36 and cover hole 38 may be considered to be the central hole of a toroid, it is possible to provide the pot core with an additional winding which passes through the central hole in one direction and back around the outside of the pot wall 30. Such a winding will be a type A winding because it is not completely enclosed by the pot core material. This winding will generate annular magnetic fields in the post and pot wall, as indicated by the arrows 50 and 52, respectively, and circular magnetic fields in the pot core cover and bottom as indicated by the arrows 54 and 56, respectively. If both the type A and type B windings are excited at the same time two mutually orthogonal magnetic fields will be present everywhere within the pot core material.

Figure 2:
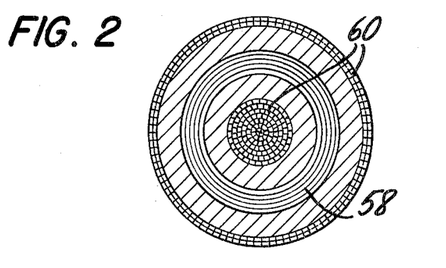
FIG. 2 is a cross-sectional view of the pot core of FIG. 1, showing the coils used to create two orthogonal magnetic fields.
Figure 3:
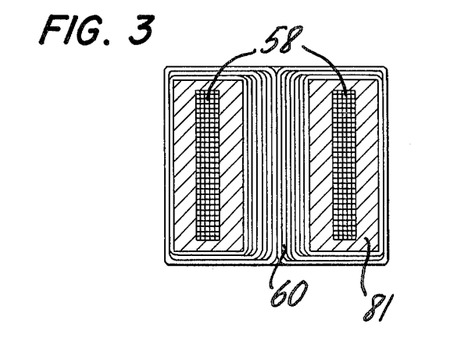
FIG. 3 is another cross-sectional view of the pot core of FIG. 1, showing the coils used to create two orthogonal magnetic fields.

FIGS. 2 and 3 are cross-sectional views of the pot core shown in FIG. 1 with the type B and type A windings in place. The type B winding 58 is a simple coil which, as mentioned above, is normally wound on a bobbin. The type A winding 60 extends through the center of the pot core (where all the winding turns are concentrated) and is wrapped around the outside with the winding turns evenly distributed around the circumference of the core.

Figure 4:
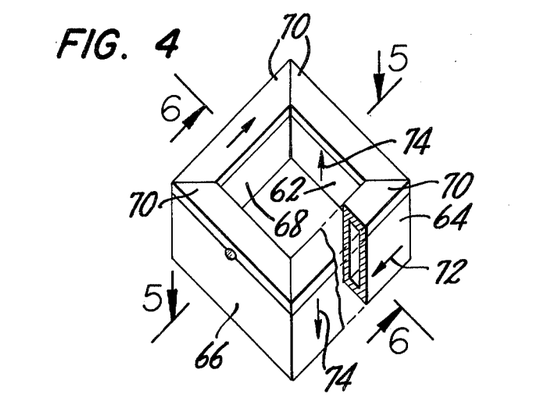
FIG. 4 is a perspective view of a C-core having the shape of a hollow, square picture frame, showing the directions of two orthogonal magnetic fields.

FIG. 4 represents a core configuration in the form of a "hollow picture frame" which may be either rectangular or square in external shape (as shown). This magnetic core is made of four separate C-core sections 62, 64, 66 and 68 with their ends mitered together. Like the pot core, each section has a cover 70 which is removed to permit insertion of a type B winding.

The directions of the magnetic fields generated by a type A wind type B winding are shown by the arrows 72 and 74, respectively. It will be seen that this hollow picture frame core configuration is really a rectangular version of a pot core having a large center hole.

Figure 5:
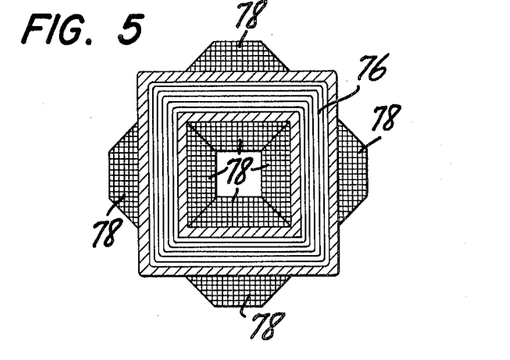
FIG. 5 is a cross-sectional view of the C-core of FIG. 4, showing the coils used to create two orthogonal magnetic fields.
Figure 6:
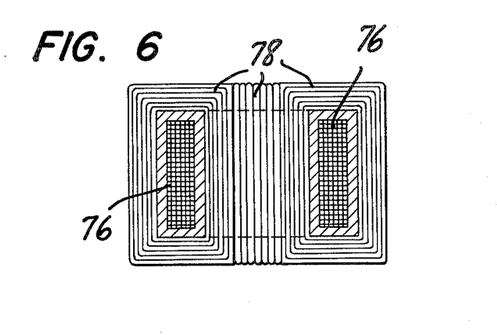
FIG. 6 is another cross-sectional view of the C-core of FIG. 4, showing the coils used to create two orthogonal magnetic fields.

FIGS. 5 and 6 are horizontal and vertical sections through the core of FIG. 4 with the type B and type A windings in place. The type B winding 76 can be bobbin loaded, after which the core pieces are assembled and banded so that the "C" is held together and the frame formed. The type A winding 78 is then toroidally wound. Ideally, the device should have equal A and B winding reluctances and equal A and B winding areas.

Figure 7:
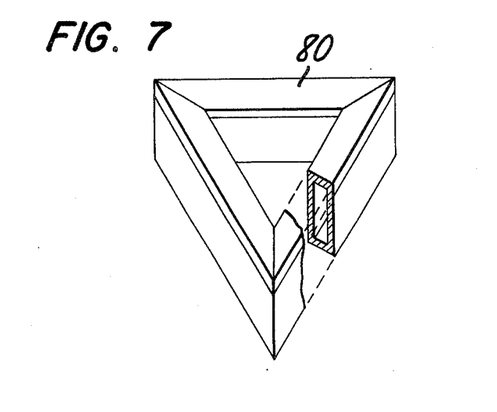
FIG. 7 is a perspective view of a C-core having the shape of a hollow, triangular picture frame.

FIG. 7 illustrates a variation of the hollow picture frame core. This core 80 is triangular in shape, rather than rectangular (square) as is the core shown in FIG. 4. This triangular core is, of course, constructed and wound in the same manner.

From a consideration of FIGS. 1-7 it will be seen that all of the cores of these orthogonal field inductive devices are actually just variations of the same basic structure or geometry. In each case, the core is formed of an "O"-shaped cross-section rotated through 360° about an axis which is spaced from the outer edge of the cross section. This rotation encloses a circuitous space within the "O" for the type B winding and surrounds an opening, which extends along the axis, for the type A winding. As used herein, the term "O"-shaped cross-section is intended to include box shaped cross secitons or any other shape which has a center opening. Whereas in the pot core configuration illustrated in FIGS. 1-3 the "O"-shaped cross-section—i.e., the material cross-section 81 indicated in FIG. 3—is rotated in a circle to form cylindrical surfaces, in the embodiments illustrated in FIGS.

4-7 the "rotation" through 360° takes place along straight line segments and forms a succession of plane surfaces or walls.

The inductive devices described above will hereinafter be termed "biaxial" because the magnetic fields generated within the core material of the devices extend in two orthogonal directions or axes. These orthogonal axes may be viewed as the X and Y axes of a Cartesian coordinate set. If, as is the case with the other embodiments to be described below, a third orthogonal magnetic field is generated within the core material, this field may be viewed as extending in the third, or Z coordinate direction in the orthogonal coordinate set.

Figure 8:
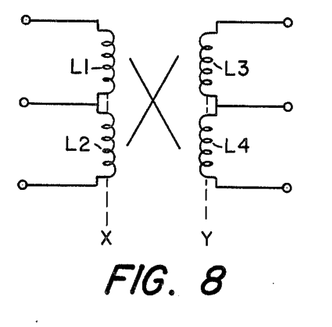
FIG. 8 is a circuit diagram showing connections to coils of a pot core inductive device in accordance with one embodiment of the present invention.

FIG. 8 is a circuit diagram for a pot core inductive device showing the convention used to indicate the magnetic field directions. Coils L1 and L2 may, for example, form the type B winding of the pot core. They are bifilar bobbin wound with one end of each coil connected together. The coils L3 and L4 thus form the type A winding and are bifilar wound directly on the core. In the circuit diagram, the coils L1 and L2 produce the magnetic field in the X direction, whereas the coils L3 and L4 produce the magnetic field in the Y direction. The core material is represented between the coils by an "X", which also indicates the cross fields within the core.

Figure 9:
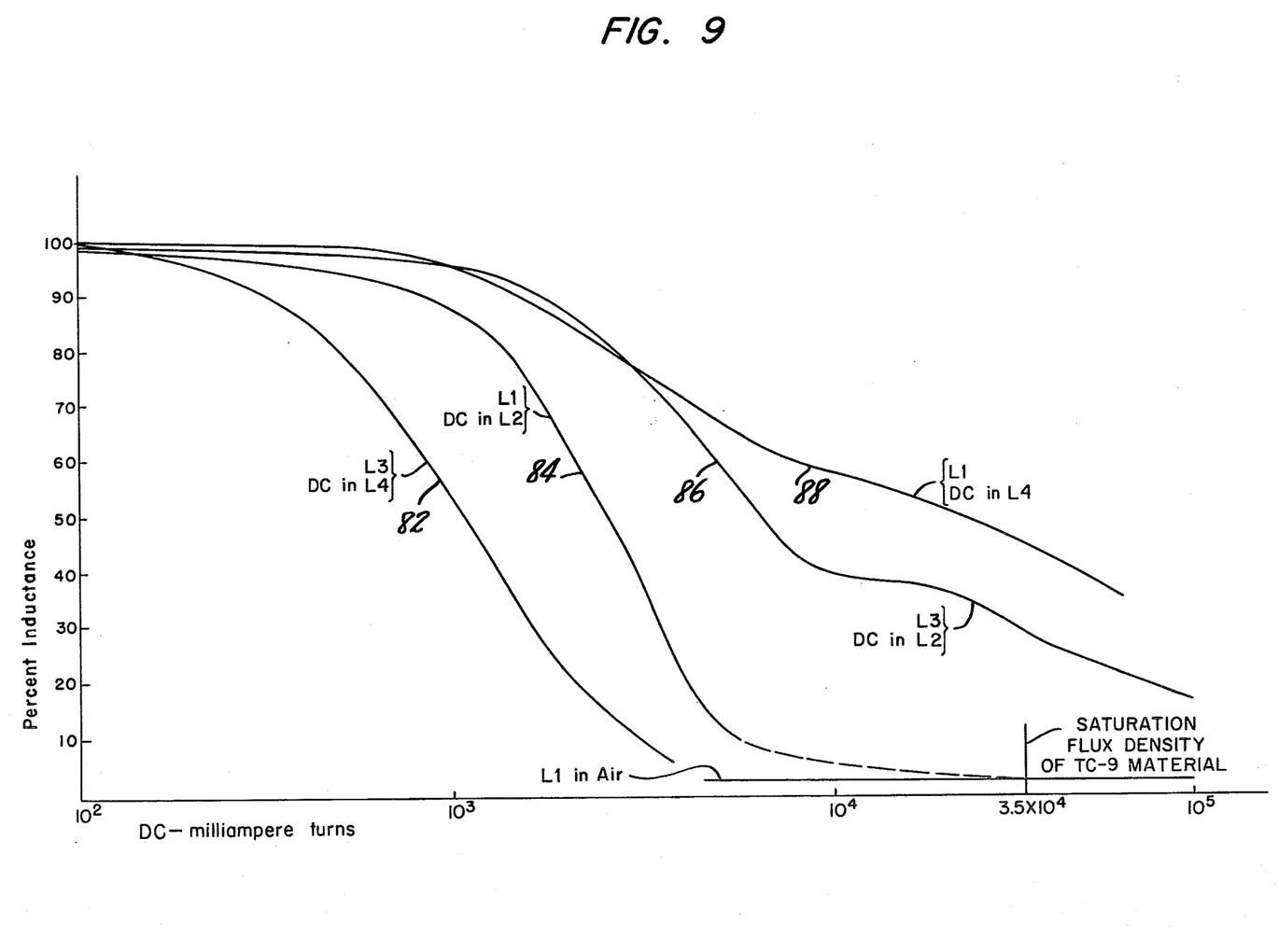
FIG. 9 is a graph of inductance as a function of current in a pot core inductive device with coils connected as shown in FIG. 8.

FIG. 9 is a graph showing the inductance curves for a standard 18×11 mm pot core supporting both a type A and a type B winding. This particular core was purchased from Indiana General under the model No. F1146-1. The core is made of TC-9 material, a molded ferrite powder, which saturates at $3.5 \times 10^4$ milliampere turns of current.

The type A and type B windings were bifilar wound and connected as shown in FIG. 8. L1 and L2 (forming the type B winding inside the core) were each 50 turns of wire on a bobbin. L3 and L4 (the type A winding through the central hole and around the outside of the pot core) were each 35 turns with a 10° pitch. Initially, the resistance and inductance of these coils were measured as follows:

| Coil | Resistance (ohms) |
|---|---|
| L1 | .633 |
| L2 | .639 |
| L3 | 1.085 |
| L4 | 1.092 |

| Coil | Inductance (henrys) |
|---|---|
| L1 | $13.05 \times 10^{-3}$ |
| L2 | $13.085 \times 10^{-3}$ |
| L3 | $10.83 \times 10^{-3}$ |
| L4 | $10.83 \times 10^{-3}$ |
| L1 + L3 | $24.1 \times 10^{-3}$ |
| L2 + L3 | $24.10 \times 10^{-3}$ |

The inductance of each coil was measured by applying a sinusoidal signal of prescribed voltage at different frequencies to the coil placed in series with a resistor. The inductive reactance $X_L$ was determined from the ratio of the voltage across the coil to current through the coil (determined from the voltage across the resistor). The inductance was then calculated using the formula:

$$L = X_L/(2\pi f)$$

where X is in ohms, the frequency f is in Herz and L is in henrys. All of these fiducial inductance values were confirmed using a General Radio inductance bridge.

After the initial inductances were recorded, the inductances of L1 and L3 were measured as a function of milliampere turns of direct current in L2 and L4. Curve 82 shows the inductance of L3 as a function of the DC current in L4; curve 84 shows the inductance of L1 as a function of the DC current in L2; curve 86 shows the inductance of L3 as a function of the DC current in L2 and curve 88 shows the inductance of L1 as a function of the DC current in L4. These data are astonishing because they indicate that the DC current in the type A winding has only a second order effect on the inductance of the type B winding and the DC current in the type B winding has only a second order effect on the inductance of the type A winding.

The behavior of the inductance of the winding toward DC in its own winding plane corresponds to well-known published data. As is shown in FIG. 9, the mutual inductance between the A and B windings is essentially zero in the absence of the DC current created field in the orthogonal direction. AC current measurements indicate approximately 0.2% transformer action between the A and B windings, 100% between the A winding coils L3 and L4 (where one is excited by the other) and 100% between the B winding coils L1 and L2. Theoretically, the cross-coupling between the AC excited A and B windings should be zero. The small (0.2%) coupling between the A and B windings is understandably due, in part, to electrostatic, rather than magnetic interaction. However, because this cross-modulation is extremely low, there are two effectively independent inductive devices arranged on the same core.

It should be noted that the curves 82 and 84 as well as the curves 86 and 88 have essentially the same shape. This demonstrates that the ferrite core material is isotropic (not crystallographic, for example). More importantly, it may be seen that the curves 86 and 88 show approximately 50% magnetic inductance at the DC current level where saturation causes the inductance represented by curves 82 and 84 to reduce to minimum. This indicates that a constant magnetic field in an orthogonal direction has some effect, but not the same effect, as the equivalent field in the direction in which inductance is measured. More will be said about this phenomenon hereinbelow in connection with FIGS. 19 and 20.

In view of the small degree cross-modulation, the biaxial inductive device according to the present invention may be used as two independent transformers operating on the same magnetic core. For example, two independent regulating, DC-to-DC converters, each of which requires a transformer, may be operated with a single pot core device described in connection with FIG. 1. Ideally, the converters should be of the balanced type so as to produce no net DC in the core. However, two single-ended converters, a single-ended converter and a balanced converter, as well as two balanced converters have all been successfully operated on an A-B wound pot core.

It should be pointed out that the center hole in standard ferrite pot cores is too small for optimal performance. The A and B winding areas as well as their reluctances should be made equal for maximum efficiency and utilization of the core material.

Figure 10:
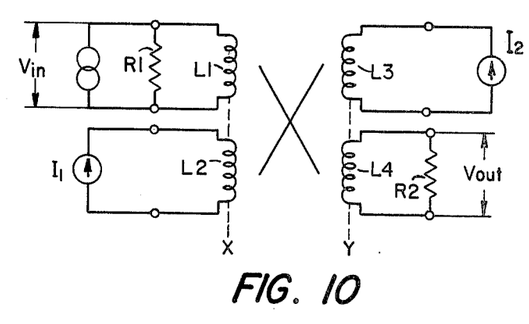
FIG. 10 is a circuit diagram showing connections to coils of a pot core inductive device in accordance with another embodiment of the present invention.

FIG. 10 shows another way of connecting the type B winding (coils L1 and L2) and the type A winding (coils L3 and L4) of a biaxial inductive device. In general, if a biaxial device has two or more A coils and two or more B coils, one A and one B coil can be devoted to a separate DC current control function. If one of the remaining A or B coils (an input coil) is excited by an AC voltage, the DC current will effectively control the amplitude of the voltage appearing at an output coil orthogonal to the input coil. The result is a "variometer", or variable output transformer with no contacts in the power path.

Figure 11:
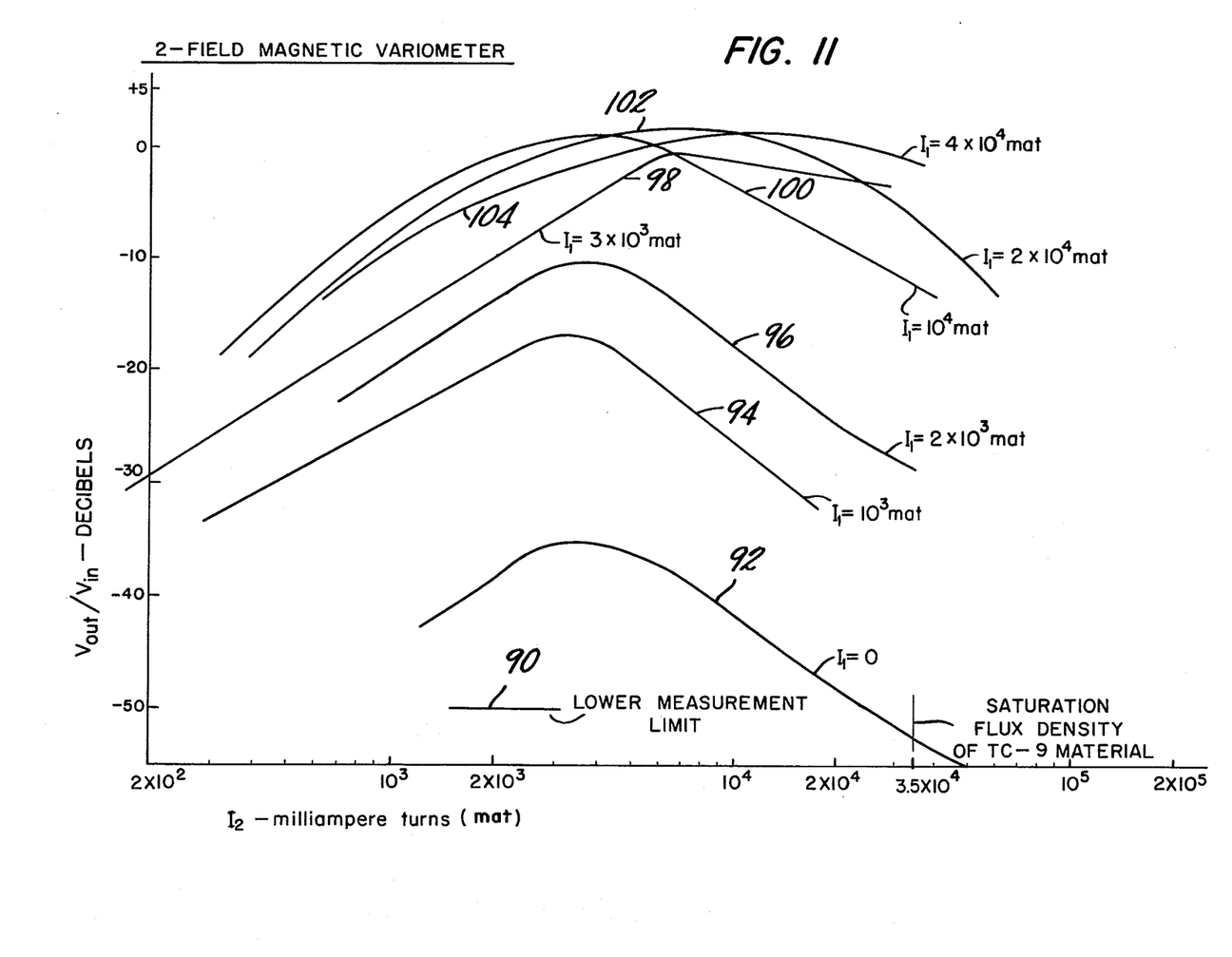
FIG. 11 is a graph of the ratio of output to input (in decibels) as a function of current in a pot core inductive device with coils connected as shown in FIG. 10.

FIG. 11 is a graph showing this control effect for the biaxial pot core device described in connection with FIG. 1. In this case, the coils L1–L4 were connected as shown in FIG. 10 with resistors R1 and R2 both having values of 100 ohms. As shown in FIG. 10, an input AC voltage $V_{in}$ was applied across R1 and L1 and the output voltage $V_{out}$ taken across L4 and R2. Control DC currents $I_1$ and $I_2$ were passed through L2 and L3, respectively.

The graph in FIG. 11 relates the output voltage $V_{out}$ to the input voltage $V_{in}$ (in decibels) as a function of the milliampere turns (mat) of control current applied to L2 and L3. The current $I_2$ applied to L3 is plotted along the horizontal axis of the graph; the current $I_1$ applied to L2 is indicated on the graph and provides a family of curves 90–104. As these curves show, the output $V_{out}$ in the absense of any DC current ($I_1=0$, $I_2=0$) was 50 db. down (0.1%) from the input $V_{in}$. By increasing $I_1$ and $I_2$, the output $V_{out}$ increased smoothly until it was equal to the input $V_{in}$. The phase of the output was positive or negative, depending upon the direction of the DC current.

In this manner it is possible to control power by varying DC current in a biaxial transformer. The application of DC current changes the coupling of the transformer so that the output is controllable over the 40–50 db. range (300/1). This range compares favorably with a variable transformer (Variac) having an armature that is moved mechanically from one end of the transformer to the other. In addition, unlike mechanical variometers, the output amplitude may be changed extremely rapidly. The rate of change depends upon the rate of change of the DC current $I_1$ and $I_2$ through the coils L2 and L3.

Because of the relatively low magnetic permeability of ferrite (approximately 1/6 of that steel) a two-field variometer would have to be very large for low frequencies. Because magnetic fields induce electric currents within the core material, it is important to keep the effective resistivity of the material high. Ferrites have naturally high resistivities, but steel does not. It is therefore desirable to build a laminated structure from sheet strip material, if low losses are to be realized with moderate size at low frequencies.

In all of the inductive devices thus far described, two orthogonal fields are produced substantially throughout the core material. A number of device configurations will now be described which are capable of creating three orthogonal magnetic fields substantially throughout the core material. These configurations are called "triaxial" devices because the fields extend in three orthogonal axes (X Y and Z) at all points within the material.

Figure 12:
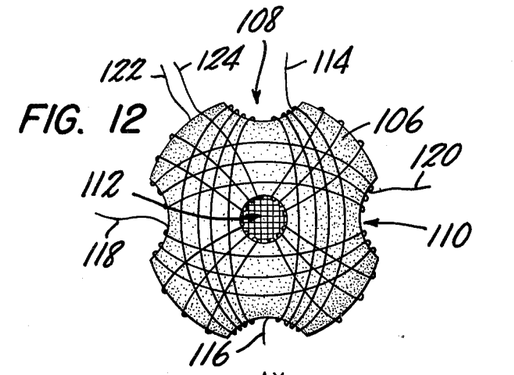
FIG. 12 is an elevational view of an inductive device, in accordance with the present invention, having a magnetic core in the shape of a spheroid.

FIG. 12 represents a triaxial inductive device formed of a solid spherical core with three mutually orthogonal holes drilled through it. While the core is shown as being exactly spherical,—i.e., with a circular circumference whereever measured—it may also be "egg-shaped"—i.e., an ellipsoid of revolution. All such structures, either exactly spherical or not, are intended to be included by referring to the core as a "spheroid".

In FIG. 12, the spheroid core 106 has openings 108, 110 and 112. A first type A winding 114–116 is wound through the opening 108; a second type A winding 118–120 is wound through the opening 110; and a third type A winding 122–124 is wound through the opening 112. Each winding, which may consist of one or more wires (coils), passes through the hole, then over the surface of the spheroid and reenters the hole as many times as required. If only two holes are wound, two orthogonal magnetic fields will be excited in the spheroid by currents in the windings. If three holes are wound, three mutually orthogonal fields will be generated.

The core structure should be made of a high resistivity ferromagnetic material; e.g., ferrite or nesting hemispherical shells of transformer steel. The three mutually orthogonal holes may be drilled or molded into the spheroid during manufacture. Each hole is then wound to the extent that, at a maximum, ⅓ of the hole area is filled. As shown in FIG. 12, each turn of a winding passes over the surface of the spheroid along a different path so that the windings are substantially evenly distributed over the surface.

Figure 13:
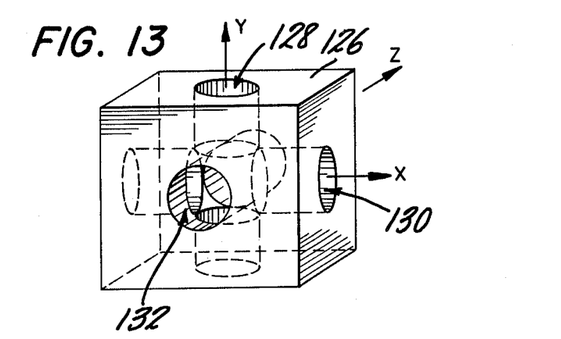
FIG. 13 is a perspective view of the core of an inductive device in the shape of a cube.

For ease of fabrication, the spheroid core may be altered to a cube or, in the general case, a rectangular parallelepiped. Such a cube-shaped structure is shown in FIG. 13. This cube 126, which is made of ferrite, has three orthogonal holes 128, 130 and 132 each passing through opposite sides and the center. Three type A windings may be passed through these holes, in the manner shown in FIG. 12, to generate the three orthogonal magnetic fields. It should be noted that the degeneration of the spherical core into a cube sacrifices material efficiency while maintaining field symmetry. The efficiency is lower because the corners of the cube are not truly utilized with the same magnetic flux density. However, the three magnetic fields remain substantially orthogonal at all points within the core.

Figure 14:
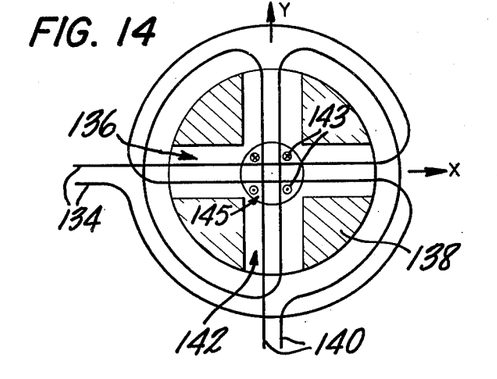
FIG. 14 is a representational diagram of one form of wiring in a spheroid core inductive device.
Figure 15:
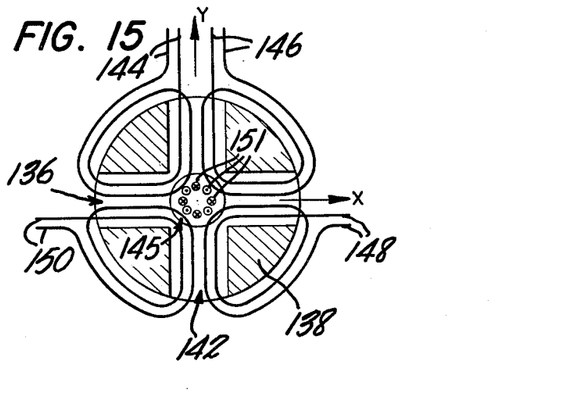
FIG. 15 is a representational diagram of another form of wiring in a spheroid core inductive device.

FIGS. 14 and 15 illustrate alternative ways of winding the triaxial, inductive device core, be it in the shape of a spheroid or a rectangular parallelepiped. FIG. 14 represents the manner in which the coils are wound in the device shown in FIG. 12. As indicated, the winding 134 passes entirely through the hole 136, which is aligned in the X axis direction, and returns around the outside surface of the core 138. The winding 140 extends entirely through the hole 142, aligned in the Y axis direction, and returns around the outside surface of the core 138. A third winding 143 is wound through the hole 145 aligned in the Z axis direction in the manner identical to the winding shown.

FIG. 15 illustrates another way of winding the core 138. In this case, the windings do not pass through a single hole of the core but make a 90° turn at the center. In particular, the winding 144 passes into the hole 136 at its entrance side and out the hole 142 at its exit side. The winding 146 passes into the hole 136 at its exit side and emerges from the hole 142 also at its exit side. Thus, the winding 144 may be described as an $(X_1, Y_2)_A$ winding where the subscript 1 refers to the entrance side of a hole, the subscript 2 refers to the exit side, and the subscript A designates the type of winding. Using this convention, the winding 146 is an $(X_2, Y_2)_A$ winding, whereas the windings 148 and 150 are $(X_2, Y_1)_A$ and $(X_1, Y_1)_A$ windings, respectively. It is also possible to provide Z axis field hole windings 151 which are $(X_1, Z_1)_A$; $(Y_2, Z_2)_A$; etc. Because the three-hole spheroid has eight quadrant symmetry, certain winding combinations are redundant.

Figure 16:
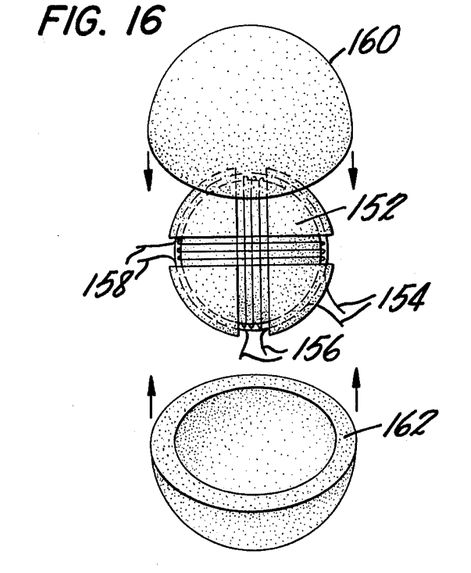
FIG. 16 is a perspective, exploded view of another (inverse) type of spheroid core inductive device in accordance with the present invention.

FIG. 16 shows a triaxial inductive device with a spherical core supporting three type B windings. This structure has an inner core 152 with windings 154, 156 and 158 arranged in three mutually orthogonal grooves. Outer cores or shells 160 and 162 are placed over the inner core 152, thus enclosing both the core and the windings.

To manufacture the triaxial inductive device shown in FIG. 16 a sphere of ferromagnetic material is cut in half and a hemispherical section removed from each half. A second sphere of the same material, having a diameter equal to the inner diameter of the first sphere, is molded or machined so that three orthogonal annular grooves are provided in its surface. Each groove is then half (or less) filled with a winding and the larger sphere is reassembled over the smaller wound sphere. The leads are brought to the outside through small holes at the interface between the larger sphere halves. The assembled sphere may be viewed as three pairs of toroids, each pair sharing 100% of the magnetic core material.

To assure substantially equal flux density throughout the device, the volume of the outer sphere should be made equal to the volume of the inner sphere. If the amount of material removed to establish the grooves is small (and can be neglected), the outside diameter of the outer sphere should be $2^{\frac{1}{3}}$ times the diameter of the inner sphere, or 1.26 times larger.

Figure 17:
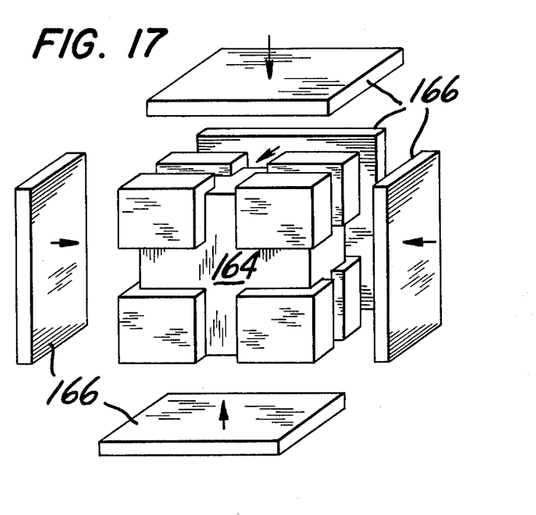
FIG. 17 is a perspective, exploded view of another cube-shaped core inductive device in accordance with the present invention.

Again, for ease of fabrication a rectangular parallelepiped or cube configuration may be used instead of the spheroid or sphere. FIG. 17 shows how a cube-shaped core may be cut and assembled. This structure is constructed by grooving all sides of an inner cube 164 and providing three windings in the manner described above in connection with FIG. 16. After winding, the inner cube is enclosed on all sides by plates 166 of ferromagnetic material. This particular structure must be made of ferrite since losses would be excessive in steel.

FIGS. 12 and 13 represent inductive device structures which accommodate only type A windings. FIGS. 16 and 17 represent device structures which accommodate only type B windings. It is easily seen that the structure of FIG. 12 or 13 may be combined with the structure of FIG. 16 or 17, respectively, to provide both A and B windings on the same core. Thus, a triaxial inductive device can be either AAA, AAB, ABB, or BBB with respect to winding type, if all three windings are present. If less than all the windings are used, the device may be AA, AB, or BB; i.e., a biaxial inductive device. The choice of winding type will depend upon the particular application involved.

Whereas a uniaxial inductive device has a single hysteresis loop, a biaxial device has two hysteresis loops and a triaxial device has three. It is therefore quite feasible, based on observed remanances, to build a 2-bit and 3-bit memory using the biaxial or triaxial device structure. Ideally, the bits should be associated with separate words because there is a modest interaction between windings which would indicate a potential cross-modulation problem. As an example, an AAA wound sphere or cube may be used in a "core" memory to provide three times the memory density of a conventional core memory.

Figures 18, 21, 22:
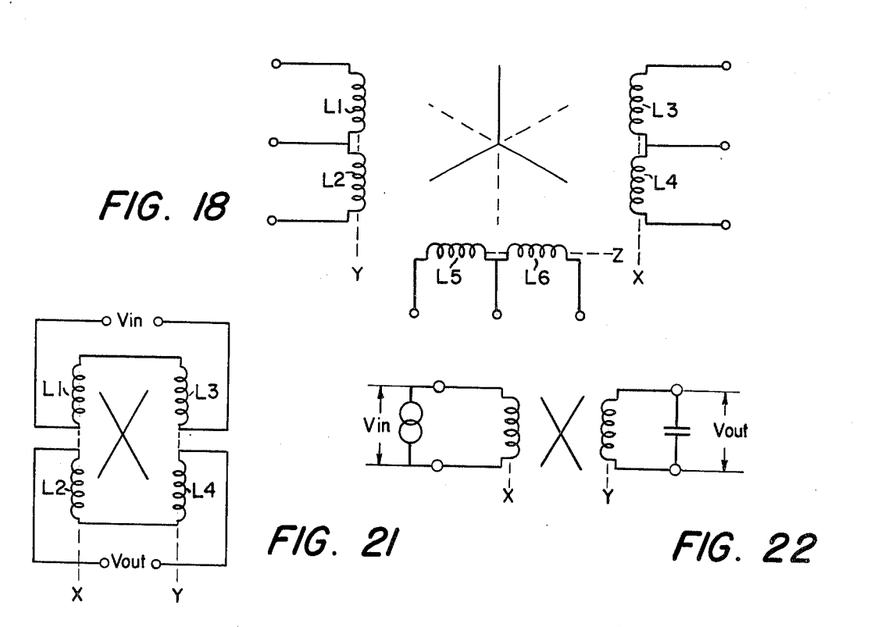
FIG. 18 is a circuit diagram showing connections to the coils of a cube-shaped or spheroid core inductive device in accordance with an embodiment of the present invention.
FIG. 21 is a circuit diagram for an orthogonal field transformer in accordance with an embodiment of the present invention.
FIG. 22 is a circuit diagram for an orthogonal field inductive device, in accordance with another embodiment of the present invention, showing its use for determining the Fourier coefficients in a periodic signal.

FIG. 18 shows one embodiment of a circuit for a triaxial inductive device; e.g., of the type illustrated in FIGS. 12-17. The windings for generating magnetic fields in the X and Y directions are identical to those shown in FIG. 8. Only the coils L5 and L6 have been added for generating a field in the Z axis direction.

Figure 19:
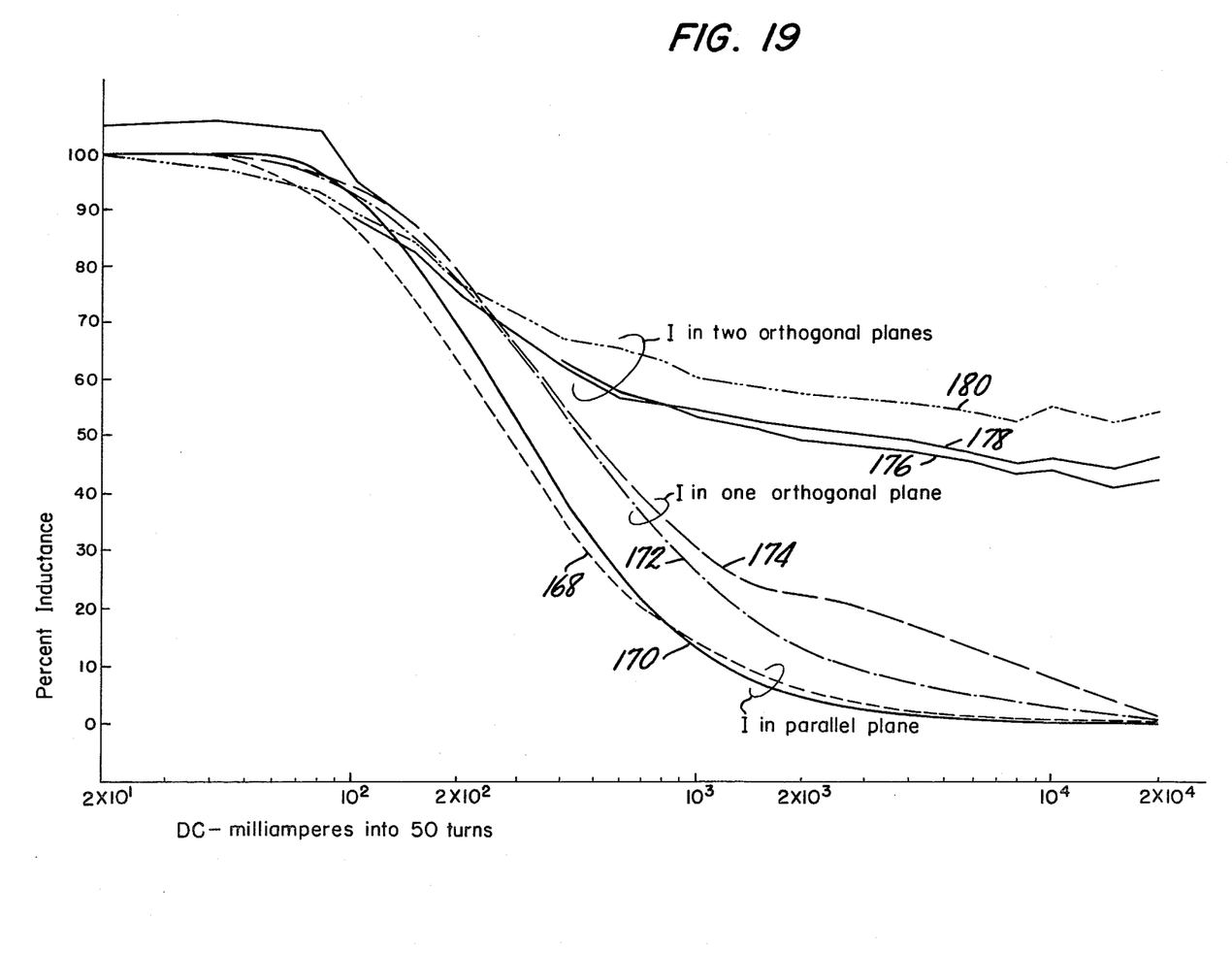
FIG. 19 is a graph of inductance as a function of current in the coils of a cube-shaped core inductive device with the coils connected as shown in FIG. 18.
Figure 20:
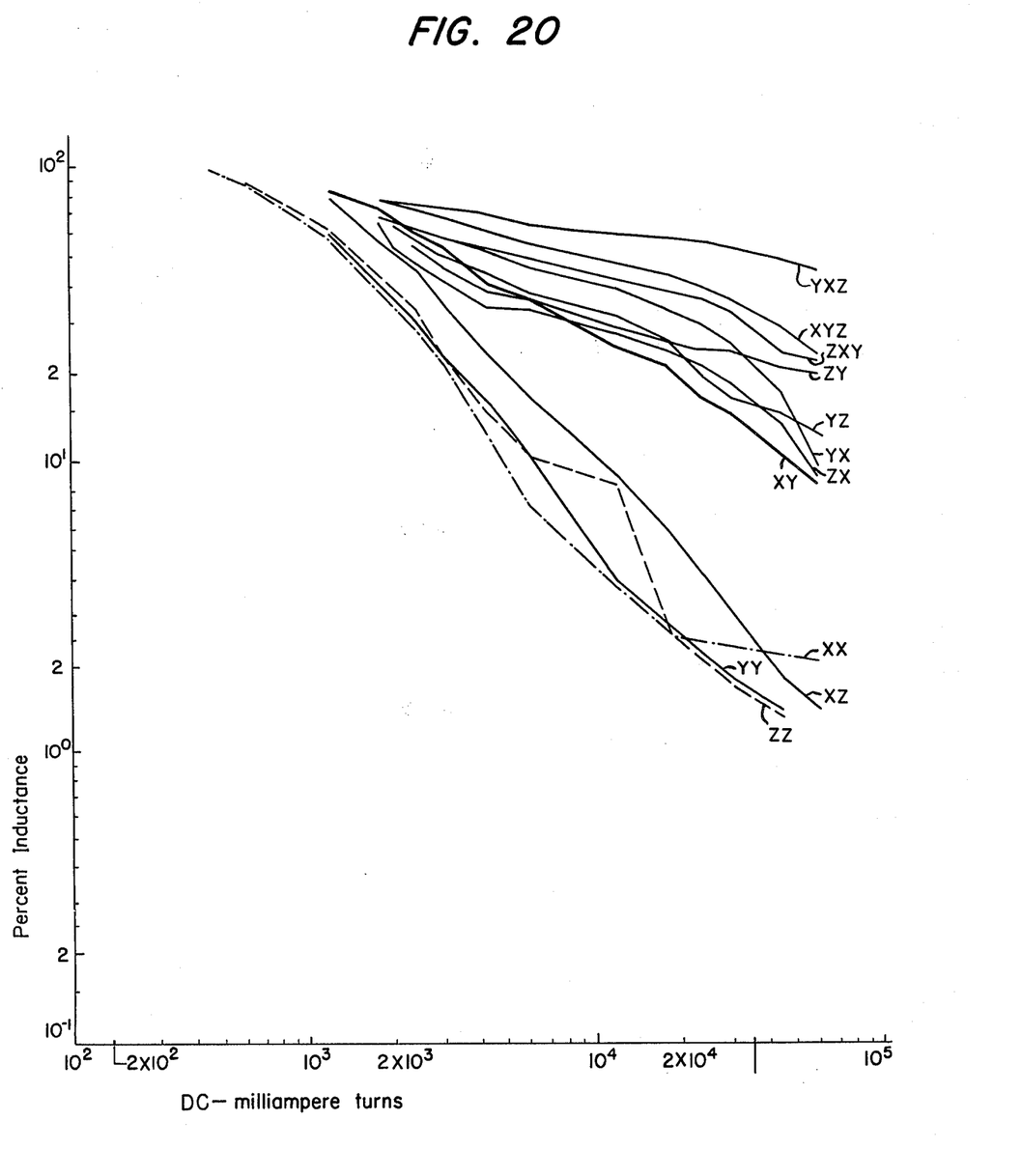
FIG. 20 is a graph of inductance as a function of current in the coils of a spheroid core inductive device with the coils connected as shown in FIG. 18.

Present uniaxial magnetic circuits transform or store energy in a single magnetic field. It appears from FIG. 9 that a biaxial field is capable of increasing the energy density in an inductive device. FIGS. 19 and 20 show that this is also the case for a triaxial field. In fact, the data demonstrate that extremely high flux densities may be achieved in two orthogonally disposed directions with a minor predictable effect on the inductive property of the remaining orthogonal direction.

FIG. 19 is a graph of the inductance characteristics of a 25 mm ferrite cube excited with direct current in one or more orthogonal planes as a function of the milliamperes applied to each winding. This particular cube was cut from an Indiana General core bearing the model No. F2141-1. Three orthogonal holes, 8 mm in diameter, were drilled through the ferrite material and each hole was bifilar wound in the manner shown in FIG. 14 with 50 turns of No. 30 AWG wire. The inductances were measured in the manner described above, in connection with the curves of FIG. 9, using the circuit of FIG. 18.

The curves 168 and 170 show the inductance of two windings of the device as a function of DC excitation in the same plane; i.e. the inductance of L1 and L3 as a function of DC current applied to L2 and L4, respectively. The curves 172 and 174 show the inductance of each winding as a function of excitation in one orthogonal plane; i.e., the inductance of L1 and L3 as a function of DC current applied to L4 and L2, respectively. These four curves closely resemble the inductance measurements made with the biaxial pot core device which are represented in FIG. 9. The curves 168 and 170 on one hand, and 172 and 174 on the other, are substantially parallel, but are shifted slightly due to fabrication and measurement errors.

The curves 176, 178 and 180 shown the inductance of the orthogonal coils L1, L3 and L5, respectively, with DC excitation in two orthogonal planes. That is, the inductance of coil L1 was measured as a function of identical DC current applied to L4 and L6; the inductance of L3 was measured as a function of identical DC current applied to L2 and L6; and the inductance of L5 was measured as a function of identical DC current applied to L2 and L4. Under such excitation conditions, the rate of fall-off of inductance was greatly retarded. As a practical matter, the core material simply could not be saturated. Its inductance properties continued to fall off smoothly in the measuring plane while the planes at right angle to it were excited far above what would be saturation density for a uniaxial magnetic field.

While the data were obtained for a triaxial inductive device structure having an AAA winding configuration, it is expected that type B windings would, if anything, further reduce the rate of fall-off of inductance because of their reduced reluctance.

FIG. 20 shows the inductance curves for a 23 mm ferrite spheroid. This core was made from a 25 mm cube obtained from a section of an Indiana General core bearing the model No. F2141-1. The cube was placed in a lathe and abraded to form three orthogonal cylinders; previously three 8 mm holes were drilled through the core orthogonal and parallel to the final cylindrical sides. It may be shown that a cube which is turned in this way is within 8% of a perfect sphere. In the particular core so made for testing, it is believed that one or more hairline cracks were created in the ferrite material, because the data obtained were slightly erratic.

After producing the core, all three holes were bifilar wound in the manner shown in FIG. 14 with 30 turns of No. 30 AWG wire. The triaxial inductive device was then tested using the circuit shown in FIG. 18.

The inductance of the winding on each axis is set forth in the graph of FIG. 20. The curves are represented by the X, Y or Z coordinates to which they relate. The first alphabetic (X, Y or Z) indicates the axis of the winding on which the inductance measurement was made. The alphabetics following the first indicate the axis or axes on which DC current was applied. The horizontal coordinate of the graph specifies the DC milliampere turns. In particular:

(1) the XX, YY and ZZ curves specify the inductance measured in the same plane as the DC current generated field;

(2) the XY, YZ, YX, YZ, ZX and ZY curves specify the inductance measured in a plane at 90° to the DC plane; and (3) The XYZ, YXZ and ZXY curves specify the inductance measured in one plane while identical DC current was applied in the two orthogonal planes.

The curves show a certain degree of dispersion not found in the measurements taken with the cube-shaped transformer of identical material described above in connection with FIG. 19. It is believed that this dispersion was caused by the hairline crack or cracks created by the triple cylinder generating process, as mentioned above.

However, despite the slightly erratic results, the curves in FIG. 20 demonstrate that the application of a DC generated field in two orthogonal planes substantially increased magnetic efficiency in a first plane. At this time, the limit of flux density in a ferrite core operated in this manner is not known. However, the curves of FIG. 20 indicate that ferrite may be worked at the flux density of steel without concurrent saturation. This is an improvement of a factor of 5, assuming a saturation density of 3500 gauss for ferrite and 18,000 gauss for steel.

One quite apparent application for a triaxial inductive device with reduced inductance fall-off caused by two DC generated orthogonal fields is in the current transformer area. Current transformers normally consist of a toroid having two separate windings, one of which consists of a low (generally 1 turn) number of turns. The other winding consists of a number of turns whose properties (induced voltage or current) are monitored to indicate what is happening in the other winding. To preserve linearity, the flux density is quite low. If a single turn is looped through two holes of the three field core, and the third hole is used to support the measurement winding, it appears that the flux density requirement is enormously relaxed, thus permitting construction of devices of smaller size at the same rating. The parameter to be measured is the inductance of the winding in the third plane.

In fact there are a virtually limitless number of applications for the triaxial inductive device according to the present invention. Because of the reduced fall-off in flux density due to the orthogonal fields, it is possible to construct a transformer which is capable of transferring more power than conventional, uniaxial transformers of the same size. It is also possible to construct a three-field magnetic variometer using the principles described above in connection with FIGS. 10 and 11 for a two-field variometer. A specific application of such a structure would be a self-regulating transformer that is capable of maintaining a constant output voltage (e.g., 110 volts). Still another application of the triaxial device is to provide three independent transformers on the same core. For example, three separate DC-to-DC converters may be constructed using three transformers in essentially the space of one.

Figure 23:
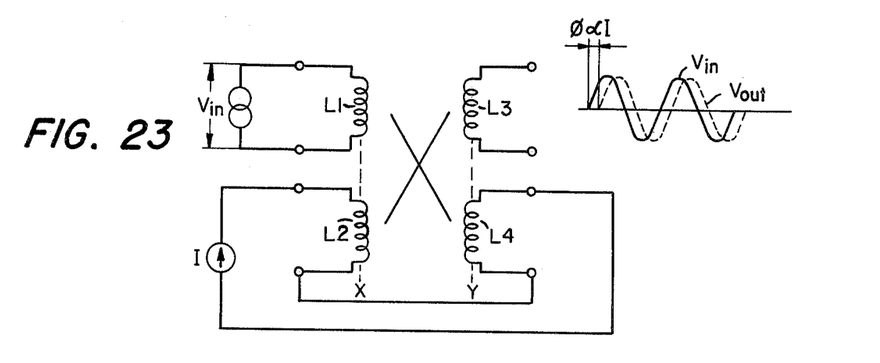
FIG. 23 is a circuit diagram for an orthogonal field inductive device, in accordance with still another embodiment of the present invention, showing its use as a variable delay.

FIGS. 21, 22 and 23 show circuit diagrams for three additional applications of the present invention. These figures illustrate specific uses of a biaxial inductive device having single or multiple coils in each winding.

FIG. 21 illustrates an application of the inductive device as a power transformer. The circuit shown is representative of a class of circuits which permit the volt-ampere capacity of a transformer to be increased without increasing the size of the transformer core. Whereas in conventional transformers a magnetic field is generated in one direction only, in accordance with the present invention additional energy may be stored in the transformer core by generating magnetic fields in two or three orthogonal directions.

In the transformer shown in FIG. 21, the primary circuit comprising the series-connected coils L1 and L3 produces fields in both the X and Y directions. Changes in the magnetic field in the X direction induce a voltage in the coil L2, and changes in the field in the Y direction induce a voltage in the coil L4. These coils L2 and L4 are also connected in series so that the induced voltages are added to produce the output voltage $V_{out}$.

While FIG. 21 illustrates the use of a biaxial inductive device as a transformer, it is quite apparent that a triaxial device may be connected in a similar manner to further increase the capacity of the transformer. In this case, the coils L1, L3 and L5 in the X, Y and Z windings, respectively, are connected to form the primary circuit, and the coils L2, L4 and L6 of the X, Y and Z windings, respectively, are connected to form the secondary circuit. In the primary circuit of either the biaxial or triaxial transformer the coils may be connected either in series, as shown in FIG. 21, or in parallel. Similarly, the coils in the secondary circuit may be connected either in series, as shown in FIG. 21, or in parallel.

The conventional way to increase the volt-ampere capacity of, and reduce the losses in, a uniaxial transformer has been to increase the size of the steel core. Increasing the core size in a transformer without increasing the ampere turns in the primary circuit reduces the transformer losses by reducing the flux density of the magnetic field. By operating lower on the saturation (hysteresis) curve the losses due to saturation are reduced. For example, for steel which saturates at 18,000 gauss, it is possible to reduce the maximum magnetic flux density from 14,000 gauss to 12,000 gauss by increasing the dimensions of the magnetic core. Such a reduction in flux density reduces the losses from 10% to 5%, respectively. According to the present invention, losses due to saturation in a transformer may be reduced, without increasing the size of the core, by dividing the ampere turns between the two or three orthogonal directions. Thus, in the case of a biaxial transformer, the magnetic flux density in each direction is one-half the flux density required for a uniaxial transformer. In the case of a triaxial transformer, the flux density in a given direction is reduced by a factor of 3. It is therefore possible to operate at a lower point on the hysteresis curves for the two or three orthogonal directions.

In practice, the primary circuits of the biaxial and triaxial transformers according to the present invention will be designed so as to produce magnetic fields, in the two or three orthogonal directions, of sufficient flux density to partially saturate the core in the orthogonal directions. Stated another way, the magnetic fields will be of sufficient flux density to drive the core into the non-linear portions of its hysteresis curves for the two or three orthogonal directions. Therefore the amount of energy stored in the transformer will be closer to the theoretical maximum for the material.

FIG. 22 represents a biaxial inductive device with an output winding in one orthogonal direction tuned by a lowloss capacitive load. If a periodic input signal $V_{in}$ is applied to the input winding of this circuit, the amplitude of the output signal $V_{out}$ will be approximately equal to the Fourier coefficients of the harmonics of the input waveform. Thus, for instance, if the output circuit is tuned to $F_0$ and the input is excited by a square wave signal $V_{in}$ which is swept in frequency from $F_0$ upward, a sinusoidal output signal $V_{out}$ will appear at $F_0$, $2F_0$, $4F_0$, $8F_0$, etc. with a peak sinusoidal amplitude approximately equal to the amplitude coefficient of the respective harmonic. Again, if a sawtooth signal $V_{in}$ is applied to the input winding and its frequency is swept upward from $F_0$, a sinusoidal output signal $V_{out}$ will appear at $F_0$, $3F_0$, $5F_0$, etc. with the amplitude of this signal representing the respective Fourier coefficient at each frequency. If a sinusoidal signal is applied to the input—i.e., the signal without harmonics—and its frequency is swept, an output signal will appear only at the fundamental $F_0$. The tuned frequency $F_0$ may be changed either by applying a biaxial DC current or by selecting another capacitor.

FIG. 23 shows a circuit for a biaxial inductive device which permits the phase of an output signal to be controlled independently of input frequency. As is apparent in the figure, a sinusoidal input signal $V_{in}$ is applied across the coil L1 and a derived output signal $V_{out}$ is taken from the coil L3. Identical DC current, I, is passed through the coils L2 and L4. If the current I=0, $V_{out}$ will be a sinusoidal signal having the same phase as, but a reduced amplitude from $V_{in}$. As the current I is increased, both the amplitude and phase $\phi$ of the signal $V_{out}$ are increased. In fact, the phase $\phi$ of $V_{out}$ with respect to $V_{in}$ increases in substantially direct proportion to the current I up to about 360°. Thus, the biaxial device may be used as a variable delay element to control the phase of an output signal with respect to an input signal.

While there have been described what are believed to be the preferred embodiments of the present invention, those skilled in the art will recognize that other and further embodiments may be constructed without departing from the spirit of the invention. For example, while certain specific applications have been referred to and described, the biaxial and triaxial inductive devices according to the invention may be used in many other applications as well. In addition, while certain device configurations have been shown and described in detail, these structures do not exhaust the possibilities for realizing biaxial and triaxial inductive devices. The following claims are therefore intended to cover all such embodiments, configurations, circuits, and the like which fall within the true spirit and scope of the invention.

We claim:

1. An inductive device comprising in combination:
a magnetic core formed of ferromagnetic material;
inductive means for producing a first magnetic field in a closed path substantially throughout said core;
inductive means for producing a second magnetic field in a closed path substantially throughout said core;
wherein said first field is substantially orthogonal to said second field at all points within said core; and
means for controlling one of said magnetic fields to reduce the rate of fall-off of the inductance of the inductive means which produces the other orthogonal field while increasing the inductive coupling between the inductive means.

2. The device defined in claim 1, further comprising inductive means for producing a third magnetic field in a closed path substantially throughout said core, said third field being substantially orthogonal to said first and second fields at all points within said core.

3. The device defined in claim 1, wherein said means for controlling one of the magnetic fields includes means for flowing a DC current through one of said inductive means for reducing the rate of fall-off of the inductance of the inductive means which produces a magnetic field in the orthogonal direction.

4. The device defined in claim 1, wherein said inductive means include a winding having terminals connected to an input voltage and an orthogonally-related winding having output terminals, and in which the means for controlling one of said magnetic fields includes a winding orthogonal to the inductive means whose inductance is to be controlled and having terminals connected to a DC bias voltage.

5. The device defined in claim 1, wherein said core is a cylindrical pot core of hollow toroidal shape accommodating one inductive means in the hollow portion thereof and another inductive means around the outside of the toroid, said core being separable to provide access to the hollow interior.

6. The device defined in claim 1, wherein said core is a continuous hollow frame having a plurality of legs and in which one inductive means is a B type winding accommodated within the hollow frame and the other is an A type winding wound on the legs of the core.

7. The device defined in claim 1, wherein each of said inductive means includes a pair of windings and including means connecting a winding of one inductive means in series with a winding of the other inductive means.

8. The device defined in claim 7, wherein said controlling means includes means for flowing a D.C. current through said series connected orthogonal windings.

9. The device defined in claim 1 or 2, wherein the outer surface of said core is a spheroid.

10. The device defined in claim 9, wherein said outer surface is substantially spherical.

11. The device defined in claim 1 or 2, wherein the outer surface of said core is a rectangular parallelepiped.

12. The device defined in claim 11, wherein said outer surface is a cube.

13. The device defined in claim 1, wherein said means for producing said first and second fields include a first and second electrical winding, respectively.

14. The device defined in claim 2, wherein said means for producing said first, second and third fields include a first, second and third electrical winding, respectively.

15. The device defined in claim 13, wherein said core is formed of an "O"-shaped cross-section rotated through 360° about an axis which is spaced from the outer edge of said cross-section, thereby enclosing a circuitous space and surrounding an opening extending along said axis; wherein said first winding is a type B winding arranged within said circuitous space; and wherein said second winding is a type A winding extending through said opening and around the outside surface of said core.

16. The device defined in claim 13 or 14, wherein said core is a solid having at least two holes passing through it in orthogonal directions; wherein said first winding is a type A winding passing through at least one of said holes and around the outside surface of said core; and wherein said second winding is a type A winding passing through at least one other of said holes and around the outside surface of said core.

17. The device defined in claim 14, wherein said core is a solid having three holes passing through it in orthogonal directions, and wherein said first, second and third windings are type A windings each extending, respectively, through at least one of said holes and around the outside surface of said core.

18. The device defined in claim 13 or 14, wherein said core is a rectangular parallelepiped comprising an inner core of rectangular parallelepiped shape having at least two grooves extending orthogonally around its outer surface and an outer shell enclosing and in contact with the surface of said inner core; and wherein said first and second windings are each arranged, respectively, in one of said grooves.

19. The device defined in claim 14, wherein said core is a rectangular parallelepiped comprising an inner core of rectangular parallelepiped shape having three grooves extending orthogonally around its outer surface and an outer shell enclosing and in contact with the surface of said inner core; and wherein said first, second and third windings are each arranged, respectively, in one of said grooves.

20. The device defined in claim 16, wherein each of said windings enter and exit the core through the same hole.

21. The device defined in claim 16, wherein each of said windings enter said core through one hole and exit from another.

22. The device defined in claim 1, wherein one of said first and second fields is maintained substantially constant while the other is varied.

23. The device defined in claim 2, wherein two of said first, second and third fields are maintained substantially constant while the other is varied.

24. The device defined in claim 13 or 14, wherein at least one of said windings includes a plurality of coils.

25. The device defined in claim 13 or 14, wherein each of said windings includes a plurality of coils.

26. The device defined in claim 24, wherein a DC current is applied to one of said coils in each of said windings, and wherein an AC voltage is applied across a coil of one of said windings and an AC voltage is taken from a coil of the other of said windings, whereby said device comprises a variometer.

27. The device defined in claim 24, wherein at least two of said windings include a primary and a secondary coil, whereby said device forms a plurality of independent transformers operating on the same core.

28. The device defined in claim 24, wherein first coils of at least two of said windings are connected in a primary circuit and second coils of at least two of said windings are connected in a secondary circuit; and wherein an AC input voltage is applied across said primary circuit and an AC output voltage is taken from said secondary circuit,
whereby said device forms a single, high capacity transformer.

29. The device defined in claim 28, wherein the coils of said primary circuit are connected in series.

30. The device defined in claim 28, wherein the coils of said secondary circuit are connected in series.

31. The device defined in claim 28, wherein the coils of said primary circuit are connected in parallel.

32. The device defined in claim 28, wherein the coils of secondary circuit are connected in parallel.

33. The device defined in claim 13 or 14, further comprising capacitor means connected across one of said windings for tuning said one winding to a prescribed frequency $F_0$,
whereby said device with a tuned one winding may be operated to determine the value of Fourier coefficients for a periodic signal applied to another of said windings.

34. The device defined in claim 24, wherein a DC current is applied to one of said coils in at least one of said windings; and wherein an input signal is applied across a coil of one of said windings and an output signal is taken from a coil of another of said windings, whereby said device delays said output signal with respect to said input signal by a phase angle substantially proportional to said DC current.

35. The device defined in claim 34, wherein said DC current is applied to each of said windings.

36. The device defined in claim 1 or 2, wherein the flux density of each magnetic field is substantially constant throughout said core.

37. A method of increasing the energy stored in an inductive device having a magnetic core formed of ferromagnetic material, said method comprising the steps of:
producing a first magnetic field in said core of sufficient flux density to at least partially saturate said core in a first direction; and
producing a second magnetic field in said core of sufficient flux density to at least partially saturate said core in a second direction which is orthogonal to said first direction and wherein the flux density of each magnetic field is substantially constant throughout said core.

38. The method defined in claim 37, futher comprising the step of producing a third magnetic field in said core of sufficient flux density to at least partially saturate said core in a third direction which is orthogonal to said first and second directions.

39. An inductive device comprising in combination:
a magnetic core formed of ferromagnetic material;
a first electrical winding for producing a first magnetic field substantially throughout said core; and
a second electrical winding for producing a second magnetic field substantially throughout said core;
wherein said first field is substantially orthogonal to said second field at all points within said core, said core is a spheroid comprising an inner spheroidal core having at least two grooves extending orthogonally around its outer surface and an outer shell enclosing and in contact with the surface of said inner core and said first and second windings are each arranged, respectively, in one of said grooves.

40. An inductive device comprising in combination:
a magnetic core formed of ferromagnetic material;
a first electrical winding for producing a first magnetic field substantially throughout said core;
a second electrical winding for producing a second magnetic field substantially throughout said core; wherein said first field is substantially orthogonal to said second field at all points within said core;
a third electrical winding for producing a third magnetic field substantially throughout said core; wherein said third field is substantially orthogonal to said first and second fields at all points within said core, said core is a spheroid comprising an inner spheroidal core having three grooves extending orthogonally around its outer surface and an outer shell enclosing and in contact with the surface of said inner core and said first, second and third windings are each arranged, respectively, in one of said grooves.

41. A method of increasing the energy stored in an inductive device having a magnetic core formed of ferromagnetic material comprising the steps of
producing a first magnetic field in a closed path substantially coextensive with said core by an inductive means,
producing a second magnetic field in a closed path substantially coextensive with said core by an inductive means, wherein said first field is substantially orthogonal to said second field at all points within the core, and
controlling one of said magnetic fields to reduce the rate of fall-off of inductance of the inductive means which produce the other orthogonal field while increasing the inductive coupling between the inductive means.

42. A method as set forth in claim 41, in which the magnetic field is controlled by flowing a DC current through the inductive means which produces the field orthogonal to the field produced by the inductive means whose inductance is to be controlled.

43. A method as set forth in claim 41, including producing a third magnetic field in a closed path substantially coextensive with said core by an inductive means and controlling at least two of said magnetic fields to reduce the rate of fall-off of inductance of the inductive means which produces the other orthogonal field.

44. An inductive device comprising
a pair of orthogonally related windings having substantially no magnetic coupling therebetween,
a magnetic core having at least two closed orthogonally-related magnetic paths, each lying in the field of one of said windings,
means for impressing an AC voltage across one of said windings for generating an output voltage in the other winding, and
means for controlling the magnetic field associated with the other winding to reduce the rate of fall-off of inductance of the winding on which the AC voltage is impressed and control the voltage across the output winding.

45. An inductive device as set forth in claim 44 including means for controlling the magnetic field associated with the winding on which the AC voltage is impressed for further controlling the voltage across the output winding.

46. An inductive device as set forth in claim 44 including a third winding orthogonally related to the other two windings, said magnetic core having a third closed magnetic path orthogonally related to the other two magnetic paths, and in which there are means for controlling the magnetic fields of at least two of the windings to control the output of the third.

47. An inductive device as set forth in claim 44 including a pair of windings magnetically associated with each closed path and means connecting a winding of each pair in series.

48. An inductive device as set forth in claim 47 in which the controlling means is in the series connected windings.

49. A method of controlling an output voltage in an inductive device embodying a magnetic core having at least two closed orthogonally related magnetic paths, each lying in the field of one of a pair of orthogonally related windings, comprising the steps of
impressing an AC voltage across one of the windings which is not normally inductively coupled with the other output winding and
controlling the magnetic field associated with the output winding to reduce the rate of fall-off of inductance of the winding on which the AC voltage is impressed and increasing the magnetic coupling between the windings to control the voltage across the output winding.

50. A method as set forth in claim 49 including controlling the magnetic field associated with the input winding for further controlling the voltage across the output windings.

51. A method as set forth in claim 49 including an inductive device including a third winding orthogonally related to the other two windings, said magnetic core having a third closed magnetic path orthogonally related to the other two magnetic paths, including controlling the magnetic fields of at least two of the windings to control the output of the third.

* * * * *